United States Patent [19]

Munter et al.

[11] 4,163,287
[45] Jul. 31, 1979

[54] BINARY MULTIPLIER CIRCUIT INCLUDING CODING CIRCUIT

[75] Inventors: Ernst A. Munter; Carmine A. Ciancibello, both of Ottawa, Canada

[73] Assignee: Northern Telecom Limited, Montreal, Canada

[21] Appl. No.: 898,165

[22] Filed: Apr. 20, 1978

[51] Int. Cl.² .................. G06F 7/52; H03K 13/24
[52] U.S. Cl. .................. 364/757; 340/347 DD
[58] Field of Search .......... 340/347 DD; 364/757, 364/758, 759

[56] References Cited

U.S. PATENT DOCUMENTS

| | | | |
|---|---|---|---|
| 3,594,560 | 7/1971 | Stanley | 340/347 DD X |
| 3,789,392 | 1/1974 | Candiani | 340/347 DD |
| 3,863,248 | 1/1975 | Deschenes et al. | 340/347 DD |
| 3,875,344 | 4/1975 | Bogart | 340/347 DD X |
| 3,945,002 | 3/1976 | Duttweiler et al. | 340/347 DD |
| 4,013,879 | 3/1977 | Bornmann et al. | 364/757 |
| 4,027,147 | 5/1977 | Majos et al. | 364/759 |
| 4,069,478 | 1/1978 | Miller | 340/347 DD |
| 4,071,743 | 1/1978 | Upton | 235/92 CV |

OTHER PUBLICATIONS

H. Kaneko, "A Unified Formulation of . . . Codes and Digital Compandors" *Bell System Technical Journal*, vol. 49, 9-1970, pp. 1555-1588.

*Primary Examiner*—Jerry Smith
*Attorney, Agent, or Firm*—Robert C. Hogeboom

[57] ABSTRACT

A binary multiplier circuit wherein the product is expressed in coded form as soon as the linear (or non-coded) product is produced. When a twelve-bit binary number is multiplied by another twelve-bit binary number a twenty-four bit binary number is produced. The twenty-four bit product can be coded as an unsigned seven-bit binary number ($\mu$-255 code) as follows. The number $33 \times 2^{11}$ in binary form is added to the linear product to form an augmented product. The number of leading zeroes in the augmented product is counted and the base-minus-one complement of the count is used for the three most significant bit positions of the coded product. The four next most significant bits of the augmented product, after the most significant logic 1, are used for the four least significant bit positions of the coded product. Suitable circuitry is described which allows the coding process, just described, to take place while the linear product is in the process of being formed, and produces the coded result when the final linear product is completed.

14 Claims, 2 Drawing Figures

FINAL EXEMPLARY CONTENTS OF REGISTER 15 (24-BIT PRODUCT)

(A) | 0 0 0 0 1 0 1 1 0 1 0 0 1 0 0 0 1 1 1 0 1 0 1 1 |

INSERT IMAGINARY BINARY POINT ↓

(B) | 0 0 0 0 1 0 1 1 0 1 0 0 1 . 0 0 0 1 1 1 0 1 0 1 1 |
      $Y_I$                      $Y_F$

NOTE: $Y = Y_I + \dfrac{Y_F}{2048}$
$= 361 + \dfrac{235}{2048}$ (C) | 1 0 0 0 0 1 . 0 0 0 |

ADD 33 (IN BINARY FORMAT) TO $Y_I$ (D) | 0 0 0 0 1 1 0 0 0 1 0 1 0 . 0 0 0 1 1 1 0 1 0 1 1 |

RESULTANT SUM Y' WHERE $Y' = Y + 33$
$= Y_I + 33 + \dfrac{Y_F}{2048}$
$= 394 + \dfrac{235}{2048}$ (E) | 1 0 0 |  COUNT LEADING ZEROES FROM Y' IN D) ABOVE (i.e. 4)

(F) | 0 1 1 |  INVERTING THE COUNT FROM E) ABOVE TO RESULT IN L=011

(G) | 1 1 0 0 0 1 . 0 1 0 0 0 0 1 1 1 0 1 0 1 1 0 0 0 0 |
    ↑          
    DISCARD   V=1000           DISCARD

THE RESULT FROM D) ABOVE IS SHIFTED TO THE LEFT A NUMBER OF BITS EQUAL TO THE COUNT IN E) ABOVE (i.e. 4). THE IMAGINARY BINARY POINT IS PLACED TO THE RIGHT OF THE SIXTH MOST SIGNIFICANT BIT. THE MOST SIGNIFICANT LOGIC 1 IS DISCARDED. V IS EQUAL TO THE 4 NEXT SIGNIFICANT BITS.

(H) | S | 0 1 1 | 1 0 0 0 |   WHICH IS THE RESULTANT CODE WORD C, PLUS A SIGN.
     SIGN  L      V

Fig-2

BINARY MULTIPLIER CIRCUIT INCLUDING CODING CIRCUIT

This invention relates generally to a multiplier circuit for multiplying two binary numbers, and more specifically to a synchronous multiplier circuit for multiplying two linear PCM (pulse code modulation) serial numbers and obtaining the product in companded (i.e., coded) PCM format.

PCM signals consist of binary code words, representing the instantaneous value of a periodically sampled and quantized analogue signal. These PCM code words are normally sent in a serial format to a receiving device where they are decoded back into an analogue approximation of the original analogue signal. In such a system, manipulations to the data being sent is preferably performed on the digital signals themselves rather than transforming the digital signals to analogue signals, performing the desired operations and then recoding to digital format again.

One operation which is performed in certain digital tone generators is multiplication. Were the PCM code linear, i.e., having no expansion or compression, a relatively simple multiplication device could be used. However, in the telephone art, a coded PCM system is employed, referred to as a $\mu 255$ coding law. The linear PCM code word comprises twelve binary bits (plus an additional one binary bit for sign, i.e., positive or negative); the coded PCM code word (according to the $\mu 255$ code) comprises seven binary bits (plus an additional one binary bit for sign).

Before a multiplication occurs, the coded PCM word must first be transformed into its linear PCM format (i.e., linearized). The multiplication is then performed. If two unsigned twelve-bit digital numbers are multiplied together, the resultant linear product will have twenty-four binary bits. This twenty-four bit linear product must then be transformed into the seven-bit coded PCM format.

The prior art shows circuits which multiply two linear digital words and produce a linear digital product. U.S. Pat. No. 4,027,147 issued May 31, 1977 to J. Majos and J. A. Lardy is an example of such a circuit. The prior art also shows circuits which expand, or compress, or otherwise modify a digital word. U.S. Pat. No. 3,594,560 issued July 20, 1971 to T. P. Stanley depicts one such circuit for expanding a digital word. U.S. Pat. No. 4,071,743 issued Jan. 31, 1978 to R. G. Upton depicts a scale converter circuit for a digital word. U.S. Pat. No. 4,069,478 issued Jan. 17, 1978 to A. J. Miller depicts a binary to binary coded decimal converter.

One problem with such devices, when used in tandem (e.g., a multiplier circuit followed by a coding circuit), is that valuable time is lost in performing the two calculations consecutively; first the multiplication is performed and then, when the multiplication is completed, the digital number is coded. In order to save time when doing the calculations, it would be desirable to perform the multiplication and the coding concurrently.

The present invention provides a multiplier-coding circuit in which the coded binary product is available from the output immediately upon completion of the multiplication.

In somewhat more detail, the present invention comprises one 25-bit shift register for storing a first 12-bit binary number (unsigned) and one 12-bit shift register for storing a second 12-bit binary number (unsigned). The output of each shift register is applied to one input of a two-input AND gate which performs the actual multiplication. A first clock controls the shifting in the first shift register. The first shift register has its output connected back to its input so that after twenty-five pulses of the first clock, the first register is back to its original status. The second shift register is controlled by a second clock which has a pulse rate 1/24 of the first clock.

The output of the AND gate is applied to an accumulator which includes a 24-bit shift register. The accumulator sums the partial products of the multiplication process (provided by the AND gate) and stores the resultant sum in its 24-bit shift register. At the start of the process the 24-bit register is initialized to $33 \times 2^{11}$ in binary format (i.e., 000000010000100000000000). A 3-bit binary counter counts the number of logic 0's input to the 24-bit register, the counter being reset to zero at the occurrence of every logic 1 being input to the 24-bit register. When the most significant logic 1 in the final linear binary product is at the input to the 24-bit shift register, the counter is set to zero for the last time. Consequently, the final count in the counter is the number of leading zeroes in the unsigned linear binary product. The binary count is then inverted (bit for bit) and the result is the 3 most significant bits in the coded product (unsigned).

Additionally, a 4-bit latch circuit is connected to the four most significant bit locations of the 24-bit register. At the occurrence of every logic 1 at the input of the 24-bit shift register, the contents of the four most significant bit locations in the 24-bit shift register are loaded into the 4-bit latch register. When the most significant logic 1 in the final linear binary product is at the input to the 24-bit shift register, the 4-bit latch circuit is loaded for the last time. The four logic bits stored in the 4-bit latch become the four least significant bits in the coded product. The coded product is now in parallel form, and a sign bit (derived by known means) can be inserted preceding the most significant bit of the coded product.

Expressed in other terms, the present invention is a multiplier circuit for multiplying a first unsigned binary number having a maximum of n binary bits by a second unsigned binary number having a maximum of m binary bits and producing an unsigned coded binary product having a maximum of q binary bits, wherein n, m and q are all positive integers, $(n+m)>q$, the multiplier circuit comprising: an accumulator means, including a shift register having $(n+m)$ bit locations for storing both the partial products and the final non-coded product of the first and second binary numbers, the register being preset to an initial binary value; a $(q-p)$ bit binary counter connected so as to increase its count by one, for every logic 0 input to the register, counter being reset to zero at the occurrence of every logic 1 at the input of the register wherein p is a positive integer, $0<p<q$; a latch circuit connected so as to receive the bits stored in the p most significant bit locations of the register, the latch circuit being responsive to the input signal to the register so as to load the bits from the register into the latch circuit at every occurrence of a logic 1 at the input to the register; the most significant bits of the coded product being the base-minus-one complement of the final count stored in the counter, and the least significant bits of the coded product being the final binary number stored in the latch circuit. In one embodiment n=12; m=12; q=7; p=4, and said initial binary value is 0000000100001000000000000.

One preferred embodiment of the invention will now be described, in more detail, with reference to the accompanying drawings wherein:

FIG. 2 is a graphic representation of the manipulations applied to the non-coded product in order to obtain the coded product.

Figure 1:
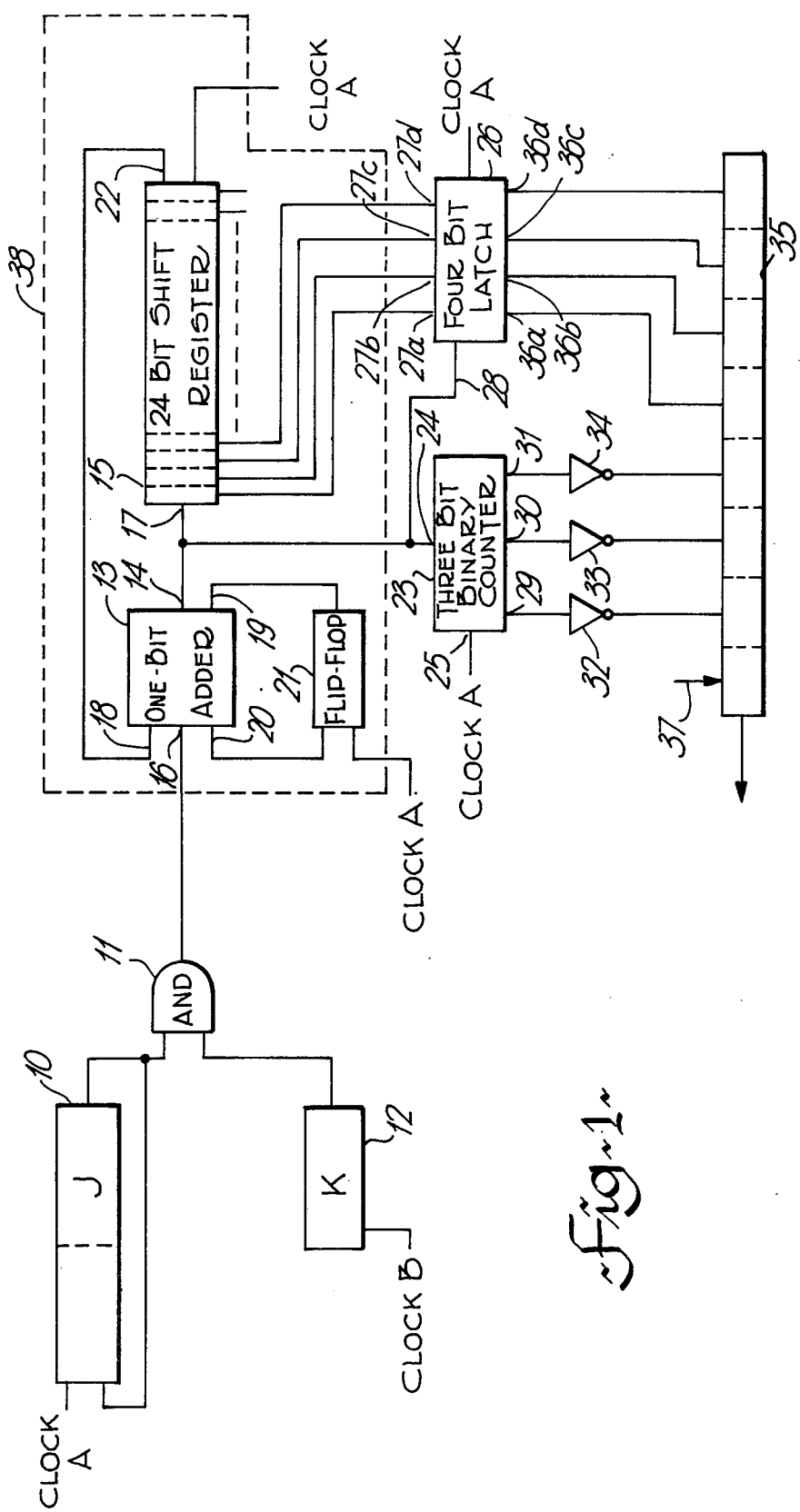
FIG. 1 is a simplified block diagram depicting a multiplier and coding circuit in accordance with the present invention.

The interconnection of the various components is shown in FIG. 1 and attention is directed to it. Shift register 10 contains 25 bit locations and accordingly will be referred to as a 25-bit shift register. In the embodiment depicted in FIG. 1, the binary number "J" to be stored in shift register 10 contains a maximum of 12 bits and when the shift register is initialized these twelve bits are situated at the right most side of register 10; i.e., in the twelve least significant bit locations of register 10. The remainder of the bit locations (i.e., the 13 most significant locations) are all at logic 0. Since the output (at the right most, or least significant bit location) of register 10 is connected back to the input (at the left most, or most significant bit location) of register 10, at each clock pulse of clock A (clock A has a frequency of 2.56 MHz) the least significant bit of information in register 10 is shifted to the most significant bit location and all the rest of the bits are shifted one bit position to their right (i.e., each bit is shifted to a bit position one bit less significant than their previous position). This process repeats itself at each pulse of clock A; consequently, after 25 pulses of clock A, register A is back to its original arrangement. As well as being connected back to the input of register 10, the output of register 10 also connects to one input of AND gate 11.

Shift register 12 is a twelve-bit binary shift register and contains a binary number "K" having a maximum of twelve bits. The output of register 12 is connected to one input of AND gate 11 as shown. Clock B provides a clock pulse to register 12 at the rate of one pulse for every 24 pulses of clock A. Every time clock B produces a pulse, the bits in register 12 are each shifted to a bit position one bit less significant than their previous position (i.e., shifted one bit position to the right). It should be noted that the numbers J and K are unsigned; the sign of the multiplication is determined by conventional methods and accordingly, will not be described herein.

AND gate 11 acts as a multiplier in the depicted circuit. If both the inputs of AND gate 11 are logic 1s, the output of AND gate 11 is a logic 1; for all other input conditions its output is a logic 0. This concept is well known.

Since clock A is pulsing at a rate 24 times as fast as clock B, the least significant bit of number K (stored in register 12) is multiplied successively by the bits stored in the least significant bit location of register 10 (which are of course, successively the logic bits comprising the number J, beginning with the least significant and progressing to the most significant, and then followed by twelve logic 0's). When clock A produces its 24th pulse, clock B produces its first pulse (i.e., clock B in effect counts the pulses produced by clock A, and when the count reaches 24 its outputs a logic 1 and resets to zero to begin counting again). The pulse from clock B causes each bit stored in register 12 to shift one position to the right (i.e., to one significant bit position lower).

The effect of this is to cause the second least significant bit of number K (now stored in the right most bit of register 12) to be multiplied successively (via AND gate 11) by one logic 0, then by the bits contained in number J, beginning with the least significant bit, and progressing to the most significant bit and followed by a string of logic 0's. It is to be noted that after 25 pulses from clock A, register 10 has completed one complete cycle and is back to it original arrangement; however, after just 24 pulses from clock A, register 10 has not quite completed one complete cycle and the effect is that all the bits in register 10 are one bit position to the left of their original starting position (i.e., one significant bit higher). Thus it can be seen that the purpose of including the extra thirteen logic 0 bits (beyond the twelve bits needed for number J) was to provide this shift in significant bit location in number J. The theory behind this shift is basic to the theory of multiplication and will not be explained in any further detail.

As explained previously the output of AND gate 11 is the product of the logic bits at its input. Consequently, the output of AND gate 11 consists of a sequence of binary digits. The output of AND gate 11 is applied to input 16 of the one-bit adder 13. The sum output 14 of adder 13 is applied to input 17 (most significant bit) of a twenty-four bit shift register 15. The output 22 of shift register 15 is applied to another input 18 of adder 13. The carry output 19 of adder 13 is applied to the carry input 20 of adder 13 via flip-flop 21. Clock A is connected to control the operation of shift register 15. At each clock pulse of clock A, register 15 adds a partial product to its contents, received from one-bit adder 13. At the end of 288 clock pulses from clock A, registers 15 contains the twenty-four bit product of the unsigned binary number J multiplied by the unsigned binary number K; the most significant bit being at the left most side of register 15 and the least significant bit being at the right side of register 15. It should be noted that when register 15 is initialized to begin its part of forming the product of two numbers it is not set to zero; but rather, register 15 is begun at the value $33 \times 2^{11}$ stored in binary format (i.e., 000000010000100000000000). The significance of this will be explained later. It should also be noted that adder 13, flip-flop 21, and register 15, in combination, form an accumulator 38.

Three-bit binary counter 23 has its reset input 24 connected to output 14 of adder 13. Counter 23 functions by counting the clock pulses applied to its clock input 25 by clock A. Every time a logic 1 pulse is received on reset input 24, counter 23 is reset back to zero, and begins its count anew. The end result of this is that, after 288 pulses of clock A, the linear product of J and K is stored in register 15, and three-bit binary counter 23 contains a count equal to the number of zeroes to the left of the most significant logic 1 stored in register 15 (i.e., the leading zeroes of the product).

Also connected to output 14 of adder 13 is the load input 28 of four-bit latch 26. Latch 26 has its four inputs 26a, 27b, 27c and 27d connected to the four most significant bit locations of register 15, as shown in FIG. 1. Whenever a logic 1 occurs on sum output 14 of adder 13, and consequently at load input 28 of latch 26, the information contained in the four most significant bit locations of register 15 is loaded into the four bits of latch 26. This loading (and subsequent reloadings) can take place many times during the multiplication process until the last logic 1 to be shifted into register 15 appears at sum output 14 of adder 13 and latch 26 is loaded for the final time; this last logic 1 will be the most significant logic 1 in the final result stored in register 15. At this point in time, four-bit latch 26 contains the four bits immediately to the right of the most significant logic 1 of the final non-coded product stored in register 15; i.e., the four less significant logic bits immediately adjacent the most significant logic 1 of the final non-coded product.

To summarize so far, the leading zeroes of the final non-coded product (i.e., the number of consecutive zeroes in the most significant bit locations of register 15) are counted, and the resultant count is stored in three-bit binary counter 23. The most significant logic 1 of the final non-coded product is used both for resetting counter 23 to zero for the last time, and for loading latch 26 for the last time. The four less significant logic bits, immediately adjacent the most significant logic 1, are stored in latch 26.

Outputs 29, 30 and 31 of counter 23 are applied to the inputs of inverters 32, 33 and 34 respectively. It should be noted that the use of counter 23 and inverters 32, 33 and 34 is equivalent to the use of a down-counter, which is well known in the art. It should also be noted that inverters 32, 33 and 34 produce the base-minus-one complement of the count stored in counter 23. The outputs of inverters 32, 33 and 34 are applied to eight-bit parallel to serial shift register 35. The outputs 36a, 36b, 36c and 36d from latch 26 are also applied to shift register 35. A sign bit 37 is applied to shift register 35 to the left of the bit from inverter 32. The format of the resultant companded (according to μ255 PCM) PCM serial output is as follows (beginning with the most significant bit and progressing to the least significant bit): sign bit; bit from inverter 32; bit from inverter 33; bit from inverter 34; bit from output 36a; bit from output 36b; bit from output 36c; and bit from output 36d.

The foregoing has been a description of the preferred embodiment of the present invention, as envisioned by the inventors, for one specific application.

A brief description of the theory underlying the operation of the circuitry of FIG. 1 will now be given.

Commencing with a 24-bit linear (i.e., non-coded) unsigned binary number Z to be converted to an unsigned 7-bit PCM (pulse code modulation) code, the binary number Z can be described as:

$$Z/2^{11} = Y = Y_I + (Y_F/2048)$$

where:
Y = a 24-bit unsigned binary number
$Y_I$ = the 13 most significant bits of number Y (integer, ranging from 0 to 8158)
$Y_F$ = the 11 least significant bits of number Y (fractional, ranging from 0 to 2047/2048).

In short, with the division of Z by the factor $2^{11}$ (i.e., 2048 a binary point has been inserted to the right of the thirteenth most significant bit of the number Z.

Now, let C be the corresponding unsigned PCM code word, such that:

$$C = 16L + V$$
$$= 2^4 L + V$$

where:
L is the 3-bit segment value
V is the 4-bit step value

The next step is to compare the number Y with all possible threshold values X, where X is defined as follows:

$$X = 2^L(2V+32) - 33$$

such that $$X_n \leq Y < X_{n+1}$$

This is accomplished according to the following procedure:

Both the number Y and the threshold values X are augmented by 33

$$Y' = Y + 33$$

recall that $Y = Y_I + (Y_F/2048)$ $$\therefore Y' = Y_I + 33 + (Y_F/2048)$$

$$X' = X + 33$$

recall that $X = 2^L(2V+32) - 33$ $$\therefore X' = 2^L(2V+32) - 33 + 33$$

$$= 2^L(2V+32)$$

The modified number (i.e., Y') is then expressed as a floating point number (note that Y'>0 and Y' ranges from 33 to 8191+2047/2048)

$$Y' = 2^L + Y'''$$

(expressed as a floating point number) with Y''' in the range $$33 \text{ to } 63 + \frac{2^{18}-1}{2^{18}}$$

and L in the range 0 to 7.

This is equivalent to shifting the number stored in register 15 to the left, by (7−L) places, to eliminate the leading zeroes and placing the imaginary binary point after what is now the sixth bit. This finds the segment bits L.

Next, both Y' and X' are divided by $2^L$ to obtain:

$$Y'/2^L = 2^L \times (Y'''/2^L)$$

$$\therefore Y''' = Y'/2^L$$

Let $X'' = X'/2^L$

Consequently $$\frac{X'}{2^L} = \frac{2^L(2V+32)}{2^L} = X''$$

$$\therefore X'' = 2V + 32$$

Equating Y''' = X'' we can then derive the step bits V:

$$Y''' = 2V + 32 + X'''$$

$$2V = Y''' - 32$$

$$V = (Y''' - 32)/2$$

Note:

Subtracting 32 from Y" has the effect of dropping the most significant bit; dividing by 2 has the effect of shifting the imaginary binary point one place to the left; if the number V is truncated (i.e., drop the bits to the right of the imaginary binary point) the four bits which are left are the step bits V of the PCM code.

FIG. 2 is a graphic representation of the theoretical manipulations applied to the final non-coded product stored in register 15. It should be noted that these manipulations do not occur in actual fact, but are shown here solely to faciliate an appreciation for the theory underlying the steps, previously described in connection with FIG. 1, which in fact do occur.

FIG. 2a, is a representation of register 15 after an exemplary multiplication has been completed. FIG. 2b depicts the insertion of an imaginary binary point after the thirteenth most significant bit. The portions $Y_I$ and $Y_F$ of the number Y are shown: $Y_I$ consists of the thirteen most significant bits, and $Y_F$ consists of the eleven least significant bits.

FIG. 2c is a representation of the number 33 (in binary format) and shows how it is added (in the proper location) to the number Y of FIG. 2b. FIG. 2d is the result of the addition of the two binary numbers Y and 33 depicted in FIG. 2b and 2c respectively.

FIG. 2e is a representation of the contents of counter 23 (see FIG. 1) after the complete multiplication. The counter 23 contains the count of the number of leading zeroes in the linear product (4 in this example). FIG. 2f is a representation of the inversion of each bit from counter 23 as performed by inverters 32, 33 and 34 of FIG. 1.

FIG. 2g depicts the binary number (from FIG. 2d) shifted sufficiently to the left so that there are no longer any leading zeroes (the leading zeroes have been shifted to the least significant bit locations). FIG. 2g depicts how the most significant logic 1 is discarded, how the next four bits become the four-bit step value V, and how the remaining bits are discarded. FIG. 2h shows how the segment value L, the step value V, and a sign bit are combined to form the coded product C with a sign.

In more general terms, consider a coded binary number, coded according to a μ law code, consisting of a total of q bits (excluding the sign bit); this coded number of q bits can be thought of as having (q−p) segments bits (L) and p step bits (V). For the unsigned μ255 code discussed previously note that q=7, p=4 and (q−p)=3. The decision levels $X_{lower}$ of the μ code (or law) are defined by:

$$X_{lower} = 2(2^L(V+2^p)-2^p)-1$$

$$= 2^L(2V+2\times 2^p)-2\times 2^p-1$$

wherein:

$X_{lower}$ is the lower bound of the level in question;

p is the number of step bits in the coded binary number;

L is the integer number (i.e., value) expressed by the (q−p) segment bits of the code;

V is the integer number (i.e. value) expressed by the p step bits of the code; and q is the total number of bits in the unsigned coded number.

The "offset" for such a coded binary number is thus $(2\times 2^p+1)$, which equals 33 for a normal 7-bit μ255 PCM number (with p=4). This is the number that was added to shift register 15 (FIG. 1), in the proper location, prior to the multiplication (see also FIG. 2c).

The linearized code, for this general PCM μ code, contains $(p+2^{(q-p)}+1)$ bits, which equals 13 (i.e., $4+2^3+1$) for a normal 7-bit μ255 PCM number. The imaginary binary point (when determining the proper location of the "offset") must be inserted, in the final linear product, after the number of bits (counting from the most significant bit; see FIG. 2b). Consequently, the number which must be added to the linear product (stored in register 15, FIG. 1) to code it, is:

$$(2\times 2^p+1)\times 2^{[(n+m)-(2(q-p)+p+1)]}$$

In the general case of binary multiplication (e.g., JJ×KK), the unsigned binary number JJ has $(p+2^{(q-p)}+1)$ bits (i.e., $4+2^3+1=13$ bits for the μ255 code). The unsigned binary number KK would also have the same number of bits as the number JJ. Depending upon the application, the number of bits in the numbers JJ and KK can vary, and the number of bits in number JJ need not equal the number of bits in number KK.

FIGS. 1 and 2 depict a circuit in the context of a digital tone generator. In this context 12 bits were used for each number J and K (FIG. 1) since these numbers were not in fact derived from PCM originally, and 12 bits were a better fit for the then available hardware.

Another coding law that is sometimes used is the A-law. Unlike the μ law, the A-law is not a regular code. The first segment of the A-law (closest to 0) is described by a different equation than is the rest of the segments. Consequently there is no "offset" with the A-law, so that the final linear product is augmented by the value zero. This means that there is the possibility that the three bit counter used in FIG. 1 could overflow. Additionally, for the zero segment of the A-code, a special output is needed (namely the 8th through 11th most significant bits, inclusive, of the linear product). If the overflow of the three-bit counter is neglected, and if the zero segment of the A-law is neglected, the circuit of FIG. 1 will apply to the A-law. Minor modifications (not depicted herein) can be made to the circuit of FIG. 1 to take account of the overflow of the three-bit counter and the zero segment of the A-code.

What is claimed is:

1. A multiplier circuit for multiplying a first unsigned binary number having a maximum of n binary bits by a second unsigned binary number having a maximum of m binary bits and producing an unsigned coded binary product having a maximum of q binary bits, wherein n, m and q are all positive integers, (n+m)>q, said multiplier circuit comprising:

an accumulator means, including a shift register having (n+m) bit locations for storing both the partial products and the final non-coded product of said first and second binary numbers, said register being preset to an initial binary value;

a (q−p) bit binary counter connected so as to increase its count by one, for every logic 0 input to said register, said counter being reset to zero at the occurrence of every logic 1 at the input of said register, wherein p is a positive integer, o<p<q;

a latch circuit connected so as to receive the bits stored in the p most significant bit locations of said register, said latch circuit being responsive to the input signal to said register so as to load the bits from said register into said latch circuit at every occurrence of a logic 1 at the input to said register;

the most significant bits of said coded product being the base-minus-one complement of the final count stored in said counter, and the least significant bits of said coded product being the final binary number stored in said latch circuit.

2. The multiplier circuit of claim 1 wherein the initial binary value to which said register is preset is:

$$(2 \times 2^p + 1) \times 2^{[(n+m)-(2(q-p)+p+1)]}$$

3. The multiplier circuit of claim 1 or 2 wherein: n=12; m=12; q=7; and p=4.

4. The multiplier circuit of claim 1 or 2 wherein: n=13; m=13; q=7; and p=4.

5. The multiplier circuit of claim 1 wherein said initial binary value of said register is 00000001000010000000000 in base two notation, n=12; m=12; q=7; and p=4.

6. In a multiplier circuit for multiplying a first unsigned binary number having n bits by a second unsigned binary number having m bits and storing both the intermediate and final results in an accumulator means, including a shift register having (n+m) bit locations, a coding circuit for transforming the final linear product into an unsigned coded product having q bits, wherein n, m, and q are all positive integers, (n+m)>q, said coding circuit comprising:

means for adding a constant binary value to the contents of said shift register;

a (q−p) bit binary counter for counting the number of leading zeroes in said final linear product, wherein p is a positive integer, p>q;

inverter means for inverting the count stored in said counter, on a bit by bit basis, to thereby provide the base-minus-one complement of the count;

a p-bit latch circuit for receiving the p less significant bits of said final linear product, immediately adjacent the most significant logic 1;

the most significant bits of said coded product being the output from said inverter means, and the least significant bits of said coded product being the output from said p-bit latch circuit.

7. The multiplier circuit of claim 6 wherein the constant binary value is:

$$(2 \times 2^p + 1) \times 2^{[(n+m)-(2(q-p)+p+1)]}$$

8. The multiplier circuit of claim 6 or 7 wherein: n=13; m=13; q=7; and p=4.

9. A coding circuit for use in a multiplier circuit used for multiplying a first unsigned binary number having n binary bits by a second unsigned binary number having m binary bits and storing the intermediate and final results in an accumulator means, including a shift register having (n+m) bit locations, said coding circuit transforming the final linear product into an unsigned coded product having q bits, wherein n, m and q are all positive integers, (n+m)>q, said coding circuit comprising:

means for adding a constant binary value to the contents of said shift register;

a (q−p) bit binary counter connected so as to count the number of zeroes input to said shift register, said counter being reset to zero at the occurrence of every logic 1 at the input of said register, wherein p is a positive integer, p<q;

inverter means for inverting the digital signals stored in said counter, on a bit by bit basis, to thereby provide the base-minus-one complement of the count;

a p-bit latch circuit connected so as to receive the bits stored in the p most significant bit locations of said register, said latch circuit being responsive to the input signal to said register so as to load the bits from said register into said p-bit latch circuit at every occurrence of a logic 1 at the input to said register;

said coded product, in parallel format, being the output from said inverter means and the output from said p-bit latch circuit, with the (q−p) bits from said inverter being in the (q−p) most significant bit locations of said coded product and the p bits from said latch circuit being in the p least significant bit locations of said coded product.

10. The coding circuit of claim 9 wherein the constant binary value is $33 \times 2^{11}$ expressed in binary form.

11. The coding circuit of claim 9 or 10 wherein: n=12; m=12; q=7 and p=4.

12. The coding circuit of claim 9 or 10 wherein: n=13; m=13; q=7 and p=4.

13. A multiplier circuit for multiplying a first unsigned binary number by a second unsigned binary number and producing the desired product in companded format, said circuit comprising:

a first shift register, having 2n+1 bit locations, for storing said first binary number, and a second shift register having n bit locations for storing said second binary number wherein said first and second binary numbers can each have a maximum of n bits, wherein n is a positive integer equal to or greater than four;

a first clock means for providing a first clock signal to said first shift register at a first rate, and a second clock means for providing a second clock signal to said second shift register at a second rate wherein the ratio of said first rate to said second rate is 2n:1;

said first shift register having its input responsive to its own output so that at each pulse of said first clock the information stored in each bit location is shifted to the next less significant bit location and the information stored in the least significant bit location is transferred to the most significant bit location of said first register;

one AND logic gate having a first input responsive to the output of said first shift register and having a second input responsive to the output of said second shift register;

accumulator means, including a third shift register having 2n bit locations, said accumulator having a first input responsive to the output of said AND gate;

means for initializing said accumulator to the value of:

$$(2 \times 2^p + 1) \times 2^{[(2n)-(2(q-p)+p+1)]}$$

in binary format, wherein p and q are positive integers, o<p<q and q<(2n);

a three-bit binary counter, incrementing its stored count by one, every pulse of said first clock means, and being responsive to the input of said third register so as to reset its count to zero at every occurrence of a logic 1 on the input of said third register;

inverter means for inverting the digital signals stored in said counter, on a bit by bit basis, so as to form the base-minus-one complement of the count;

a four-bit latch means connected so as to receive the bits stored in the four most significant bit locations of said third register, said four-bit latch means being responsive to the input of said third register so as to load the bits from said third register into said four-bit latch means at every occurrence of a logic 1 at the input of said third register;

the most significant bits of said product, in companded format, being the output of said inverter means and the least significant bits of the companded product being the output of said four-bit latch means.

14. The multiplier circuit of claim 13 wherein: $n=12$; $q=7$; and $p=4$.